(12) United States Patent
Nishizawa et al.

(10) Patent No.: US 7,212,086 B2
(45) Date of Patent: May 1, 2007

(54) SURFACE ACOUSTIC WAVE DEVICE

(75) Inventors: Toshio Nishizawa, Yokohama (JP);
Toshihiko Murata, Yokohama (JP);
Seiichi Mitobe, Yokohama (JP)

(73) Assignee: Fujitsu Media Devices Limited,
Yokohama (JP)

( * ) Notice: Subject to any disclaimer, the term of this patent is extended or adjusted under 35 U.S.C. 154(b) by 0 days.

(21) Appl. No.: 11/214,014

(22) Filed: Aug. 30, 2005

(65) Prior Publication Data
US 2006/0044079 A1   Mar. 2, 2006

(30) Foreign Application Priority Data
Aug. 31, 2004   (JP)   ............... 2004-252644

(51) Int. Cl.
*H03H 9/64*   (2006.01)
(52) U.S. Cl. ..................... 333/193; 333/195
(58) Field of Classification Search ............ 333/4, 333/5, 24 R, 193, 194, 195
See application file for complete search history.

(56) References Cited

U.S. PATENT DOCUMENTS

| | | | | |
|---|---|---|---|---|
| 4,814,658 A | * | 3/1989 | Suthers et al. ......... 310/313 D |
| 5,515,015 A | * | 5/1996 | Nakata ................... 333/193 |
| 5,864,260 A | * | 1/1999 | Lee ........................ 333/133 |
| 6,972,644 B2 | * | 12/2005 | Nishizawa et al. ..... 333/195 |
| 2003/0160665 A1 | * | 8/2003 | Hagn et al. ............. 333/195 |
| 2003/0214369 A1 | * | 11/2003 | Kearns .................. 333/133 |
| 2004/0075511 A1 | * | 4/2004 | Inoue et al. ............ 333/195 |
| 2004/0130411 A1 | * | 7/2004 | Beaudin et al. ........ 333/133 |

FOREIGN PATENT DOCUMENTS

| | | | |
|---|---|---|---|
| JP | 6-204781 A | | 7/1994 |
| JP | WO 2003/071678 | * | 8/2003 |
| JP | 2004-194269 A | | 7/2004 |

\* cited by examiner

*Primary Examiner*—Robert Pascal
*Assistant Examiner*—Ryan Johnson
(74) *Attorney, Agent, or Firm*—Arent Fox LLP

(57) ABSTRACT

A surface acoustic wave device having a given impedance includes multimode type filters connected in series. A composite impedance of the multimode type filters defines the given impedance of the surface acoustic wave device.

15 Claims, 17 Drawing Sheets

SURFACE ACOUSTIC WAVE DEVICE

BACKGROUND OF THE INVENTION

1. Field of the Invention

The invention generally relates to surface acoustic wave devices, and more particularly, to a surface acoustic wave device of a multimode type.

2. Description of the Related Art

Recently, filters formed by surface acoustic wave devices have been used in RF circuits of radio communications devices such as portable phones. The filters formed by the surface acoustic wave devices (SAW devices) may be used as a transmit filter, a reception filter and a duplexer in which the transmit filter and the receive filters are mounted in a single package. Various types of SAW filters are known, and are typically a ladder type SAW filter has SAW resonators arranged in a ladder formation, and a multimode type SAW filter. Generally, the ladder type SAW filter is used as a transmit filter, and the multimode type SAW filter is used as a receive filter.

As described in Japanese Patent Application Publication No. 2004-194269, the fundamental structure of the multimode type SAW filter has a pair of reflection electrodes formed on a piezoelectric substrate, and input and output interdigital transducers (IDTs) arranged between the reflection electrodes. When a drive voltage is applied across the input IDT, SAWs are propagated between the reflection electrodes, and multiple standing waves are produced between the reflection electrodes. A voltage based on the standing waves develops across the output IDT. The multimode type SAW filter thus formed functions as a bandpass filter.

FIG. 1A shows a unit of the multimode type SAW filter (fundamental structure), and FIG. 1B shows a cascade type in which two units are cascaded. A multimode type SAW filter 10 of the unit type includes an input IDT 12, output IDTs 14 and 16 arranged at opposing sides of the input IDT 12, and reflection electrodes 18 and 20 located further out than the output IDTs 14 and 16. Each of the input IDT 12, and the output IDTs 14 and 16 has a pair of comb-like electrodes in which electrode fingers are interleaved. The input IDT 12, the output IDTs 14 and 16, and the reflection electrodes 18 and 20 are formed by metal patterns formed on a piezoelectric substrate, which may be LN (lithium niobate) or LT (lithium tantalate). The impedance Fs of the unit type is designed so as to be equal to the characteristic impedance of a transmission line (for example, 50 Ω) connected to the SAW filter. The cascade type of multimode type SAW filter shown in FIG. 1B has two multimode type SAW filters that are cascaded. More specifically, two output IDTs of the multimode type SAW filter 10A are connected to two input IDTs of the multimode type SAW filter 10B through signal patterns 22 and 24, respectively. A comb-like electrode 12a of the input IDT of the multimode type SAW filter 10A and a comb-like electrode 12b of the output IDT of the multimode type SAW filter 10B are grounded. Since the comb-lie electrodes 12a and 12b are grounded, no signals are transmitted therebetween. The impedance Fi of the multimode type SAW filter 10A and the impedance Fo of the multimode type SAW filter 10B are both equal to the characteristic impedance of a transmission line connected to the SAW filter shown in FIG. 1B, and may be equal to, for example, 50 Ω (Fs=Fi=50 Ω).

FIG. 2 shows an arrangement in which three cascaded multimode type SAW filters, each shown in FIG. 1B, are connected in parallel.

The multimode type SAW filters shown in FIGS. 1A and 1B may be used as shown in FIG. 3A. A transmit filter Tx and a receive filter Rx are connected to an antenna Ant. The receive filter Rx is the multimode type SAW filter. A transmitted signal is output to the antenna Ant through the transmit filter Tx. A signal received via the antenna Ant is applied to a next-stage circuit through the receive filter Rx.

However, the inventors found out the following problem. If a Jammer (a frequency component in a desired receive frequency range) is received while the signal is being sent, a leakage component of the transmitted signal excites the multimode type SAW filter of the receive filter Rx together with the Jammer. This problem is shown in FIG. 3B, in which the horizontal axis (MHz) denotes the frequency and the vertical axis denotes the output power (dBm) of the receive filter Rx. As shown in FIG. 3B, only the Jammer appears at the output port of the receive filter Rx in the absence of the transmitted signal. In contrast, when a leakage component of the transmitted signal exists, power components appear at both sides of the peak of the Jammer resulting from the leakage component. The power components increase the intermodulation level and may degrade the single tone defense (STD), which is described in the standardized specification of portable phones. This problem occurs in not only an arrangement in which the transmit filter Tx and the receive filter Rx are formed by separate piezoelectric substrates but also an arrangement with a single piezoelectric substrate on which the transmit filter Tx and the receive filter Rx are formed.

SUMMARY OF THE INVENTION

It is an object of the present invention to provide a SAW device having a multimode type SAW filter having excellent filter characteristics even in the presence of an external leakage signal.

This object of the present invention is achieved by a surface acoustic wave device having a given impedance including: multimode type filters connected in series, a composite impedance of the multimode type filters defining the given impedance of the surface acoustic wave device.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to the accompanying drawings, of preferred embodiments of the present invention.

[First Embodiment]

Figure 4A:
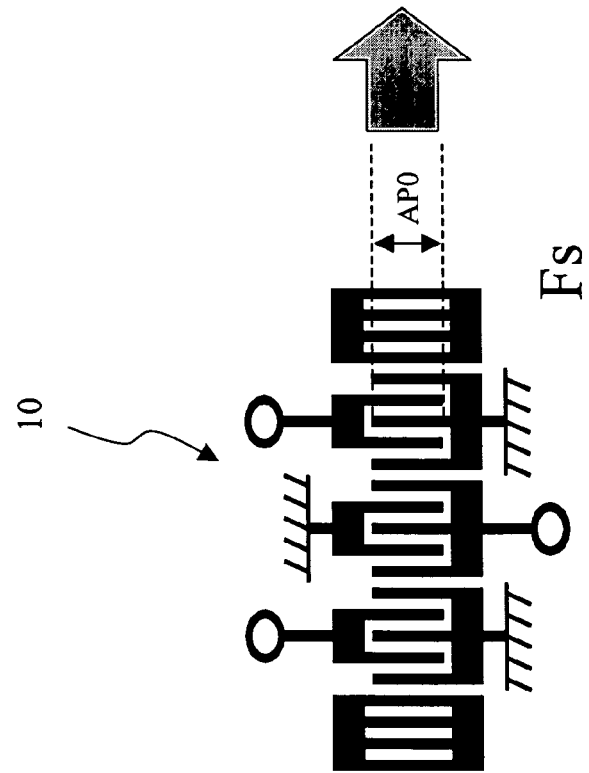
FIG. 4A shows the unit of the multimode type filter.
Figure 4B:
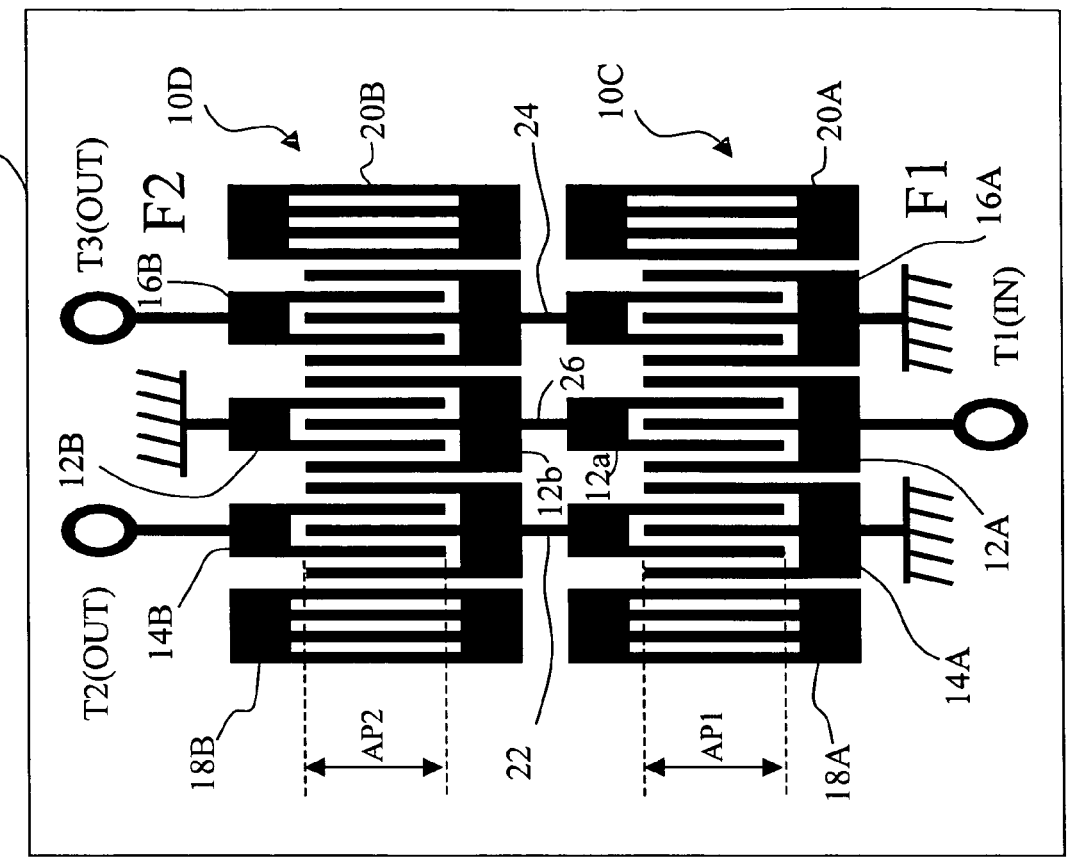
FIG. 4B shows a multimode type SAW filter according to a first embodiment of the present invention.

FIG. 4B shows a multimode type SAW filter according to a first embodiment of the present invention, and FIG. 4A shows the aforementioned unit of the multimode type SAW filter that is illustrate for comparison with the first embodiment. The multimode type SAW filter shown in FIG. 4B has two multimode type SAW filters 10C and 10D, which are formed on a piezoelectric substrate 100 and are connected in series. In the following, the multimode type SAW filters 10C and 10D may be referred to as first and second filters, respectively. The first filter 10C has a pair of reflection electrodes 18A and 20A, and input and output IDTs 12A, 14A and 16A interposed between the reflection electrodes 18A and 20A. Similarly, the second filter 10D has a pair of reflection electrodes 18B and 20B, and input and output ITDs 12B, 14B and 16B interposed between the reflection electrodes 18B and 20B.

Figure 1B:
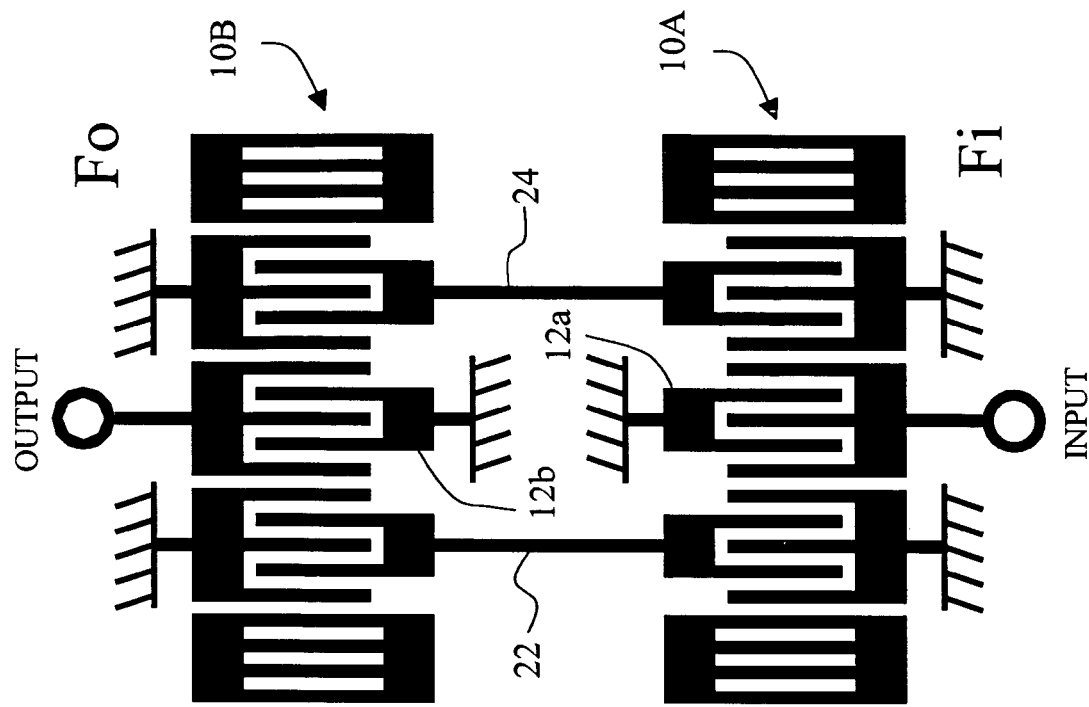
FIG. 1B shows a conventional multimode type SAW filter having two multimode type SAW filters of unit type that are cascaded.

In order to connect the first and second filters 10C and 10D in series, patterned interconnection patterns 22, 24 and 26 are connected as shown. The interconnection patterns 22 and 24 connect the output IDTs of the first filter 10C and the output IDTs of the second filter 10D. The interconnection pattern 26 connects the input IDT of the first filter 10C and the input IDT of the second filter 10D. That is, the corresponding IDTs of the first and second filters 10C and 10D are connected in series. In operation, the potential of the interconnection pattern 26, in other words, the potentials of the comb-like electrodes 12a and 12b are an intermediate potential between a drive voltage applied to an input terminal T1 and ground potential. The input IDT of the first filter 10C excites SAW by the difference between the drive potential and the intermediate potential. The input IDT of the second filter 10D excites SAW by the difference between the intermediate potential and the ground potential. It is to be noted that the comb-like electrodes 12a and 12b are not at the ground potential, and this is quite different from the structure shown in FIG. 1B. Output signals in phase are available at output terminals T2 and T3.

Since the first and second filters 10C and 10D are connected in series, it is required to design the impedance so that the composite impedance of the impedance F1 of the first filter 10C and the impedance F2 of the second filter 10D has a desired impedance (for example, 50 Ω). The desired impedance may be equal to the characteristic impedance of transmission lines to which the multimode type SAW filter shown in FIG. 4B is connected. When the unit type shown in FIG. 4A has the impedance Fs equal to 50 Ω, the aperture length AP1 (the interleaving width of electrode fingers) of the first filter 10C and the aperture length AP2 of the second filter 10D are set larger than the aperture length AP0 of the unit type in order to equal F1+F2 to Fs (=50 Ω). Thus, the IDT areas of the first and second filters 10C and 10D are both greater than the IDT area of the unit type. In the example shown in FIG. 4B, AP1=AP2 (=2AP0), and the IDT area of the first filter 10C and the IDT area of the second filter 10D are equal to each other. It may be said that the structure shown in FIG. 4B is formed by dividing the structure of the unit type into two. The multimode type SAW filters having different aperture lengths may have different electrostatic capacitances.

Figure 5:
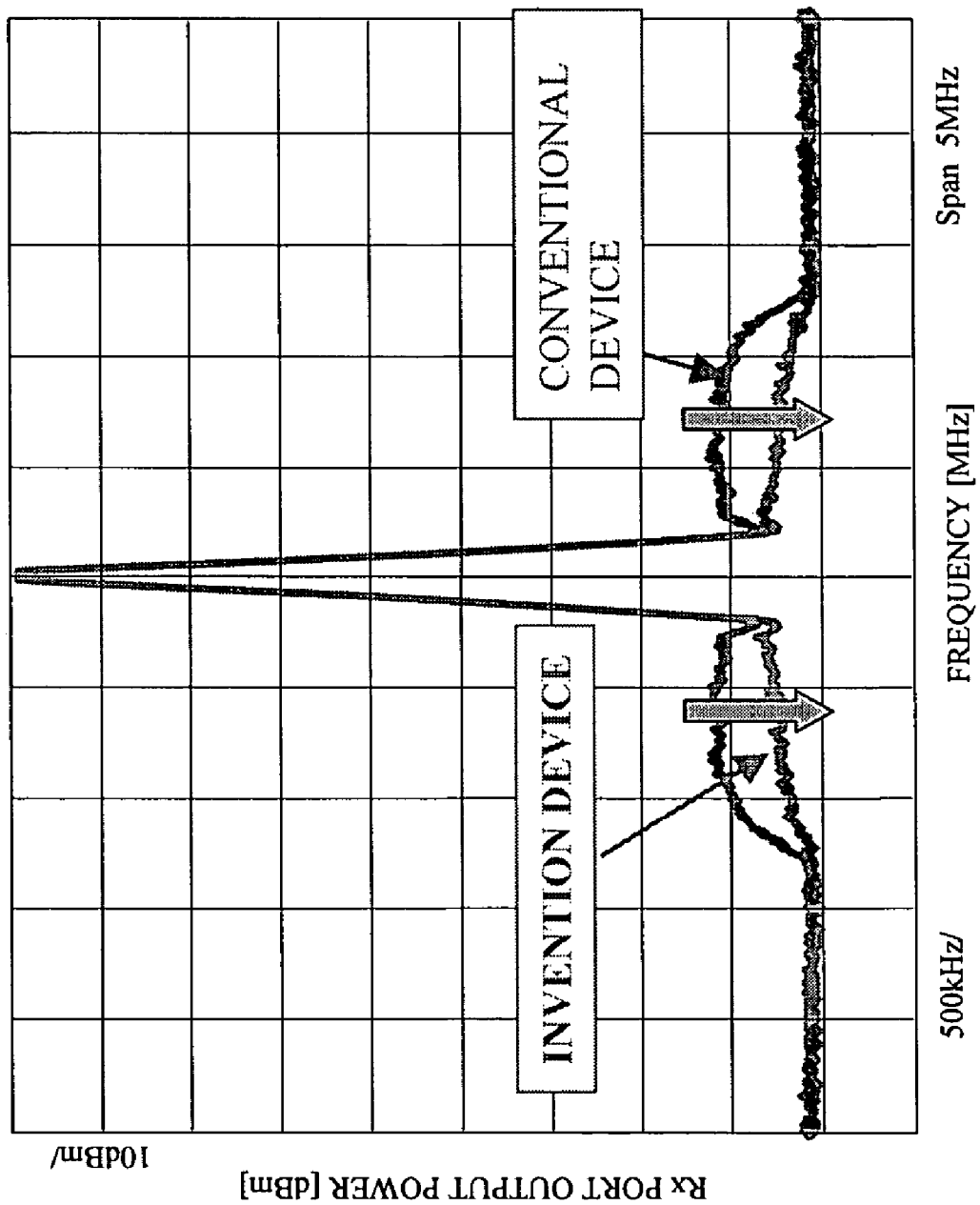
FIG. 5 is a graph of intermodulation levels of the multimode type SAW filter shown in FIG. 4B and the conventional multimode type SAW filter.

According to the structure shown in FIG. 4B, the series connection of multiple stages (two stages in FIG. 4B) decreases the voltages applied across the IDTs and enables divided voltages to be applied across the IDTs. The enlarged IDT areas reduce SAW excitation energy per unit area. As a result, as shown in a graph of FIG. 5, the "invention" device having the structure shown in FIG. 4B has a restrained intermodulation level, as compared to the "conventional" device having the structure shown in FIG. 1B.

Figure 6:
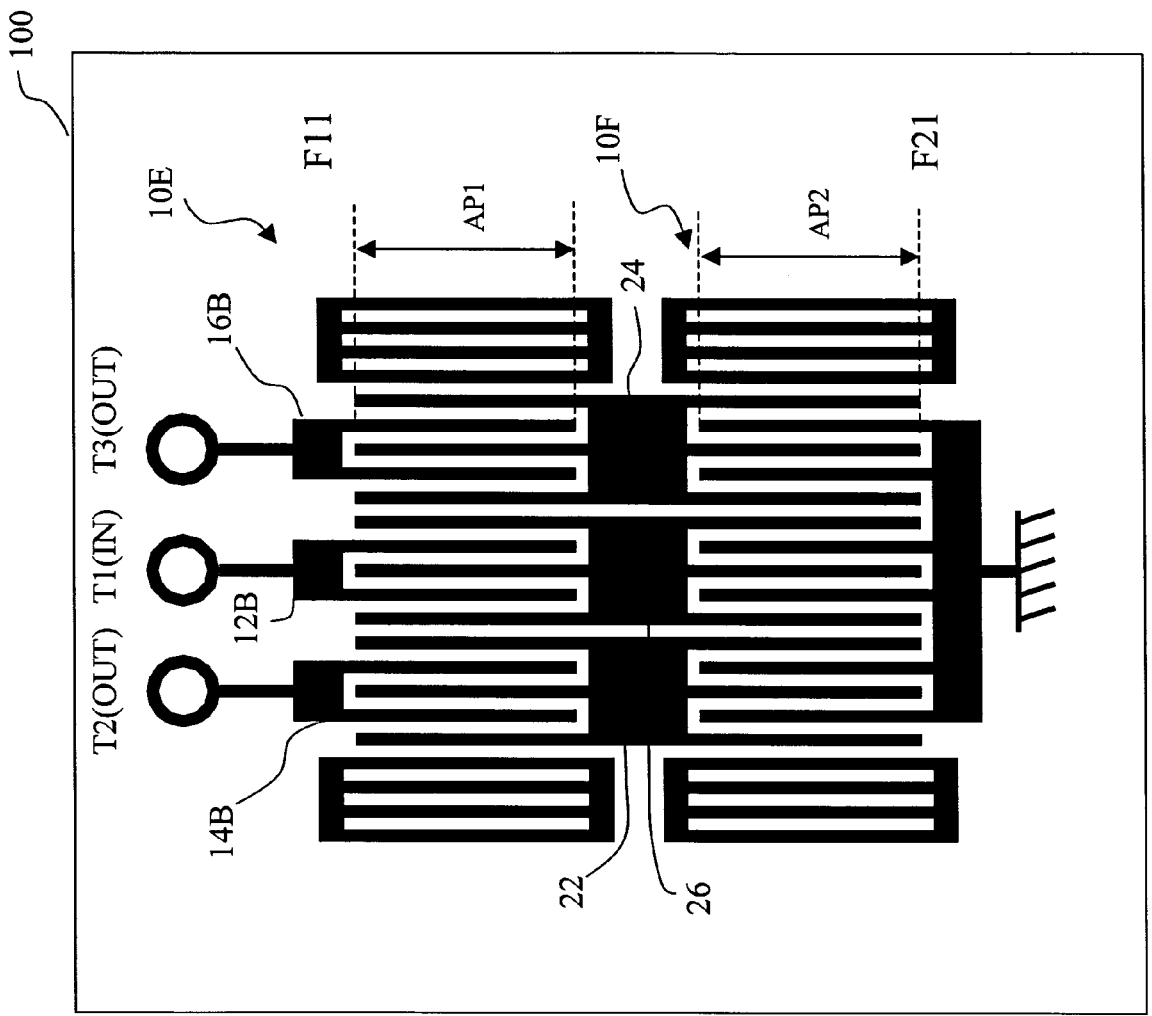
FIG. 6 shows a variation of the structure shown in FIG. 4B.

In the structure shown in FIG. 4B, the input terminal T1 and the output terminals T2 and T3 are arranged so as to sandwich the electrode patterns. In contrast, as shown in FIG. 6, the input terminal T1 and the output terminals T2 and T3 are arranged at an identical side of the electrode patterns. In the multimode type SAW filter shown in FIG. 6 has two multimode type SAW filters 10E (first filter) and 10F (second filter) connected in series. The interconnection patterns 22, 24 and 26 for making the series connections are also bus bars of the IDTs. That is, the bus bars of the first filter 10E and the corresponding bus bars of the second filter 10F are connected in series by the common bus bars 22, 24 and 26. The input terminal T1 and the output terminals T2 and T3 are respectively provided to the three IDTs of the first filter 10E. The composite impedance of the impedance F11 of the first filter 10E and the impedance F12 of the second filter 10F is equal to the characteristic impedance of the transmission lines to which the multimode type SAW filter shown in FIG. 6 are connected (for example, 50 Ω). The output IDTs 14B and 16B are arranged so that the signals at the terminals T2 and T3 are in phase (identical polarization). More specifically, the electrode finger of the IDT 14B adjacent to the IDT 12B is connected to the bus bar 22, and the electrode filter of the IDT 16B adjacent to the IDT 12B is connected to the bus bar 24.

Figure 7:
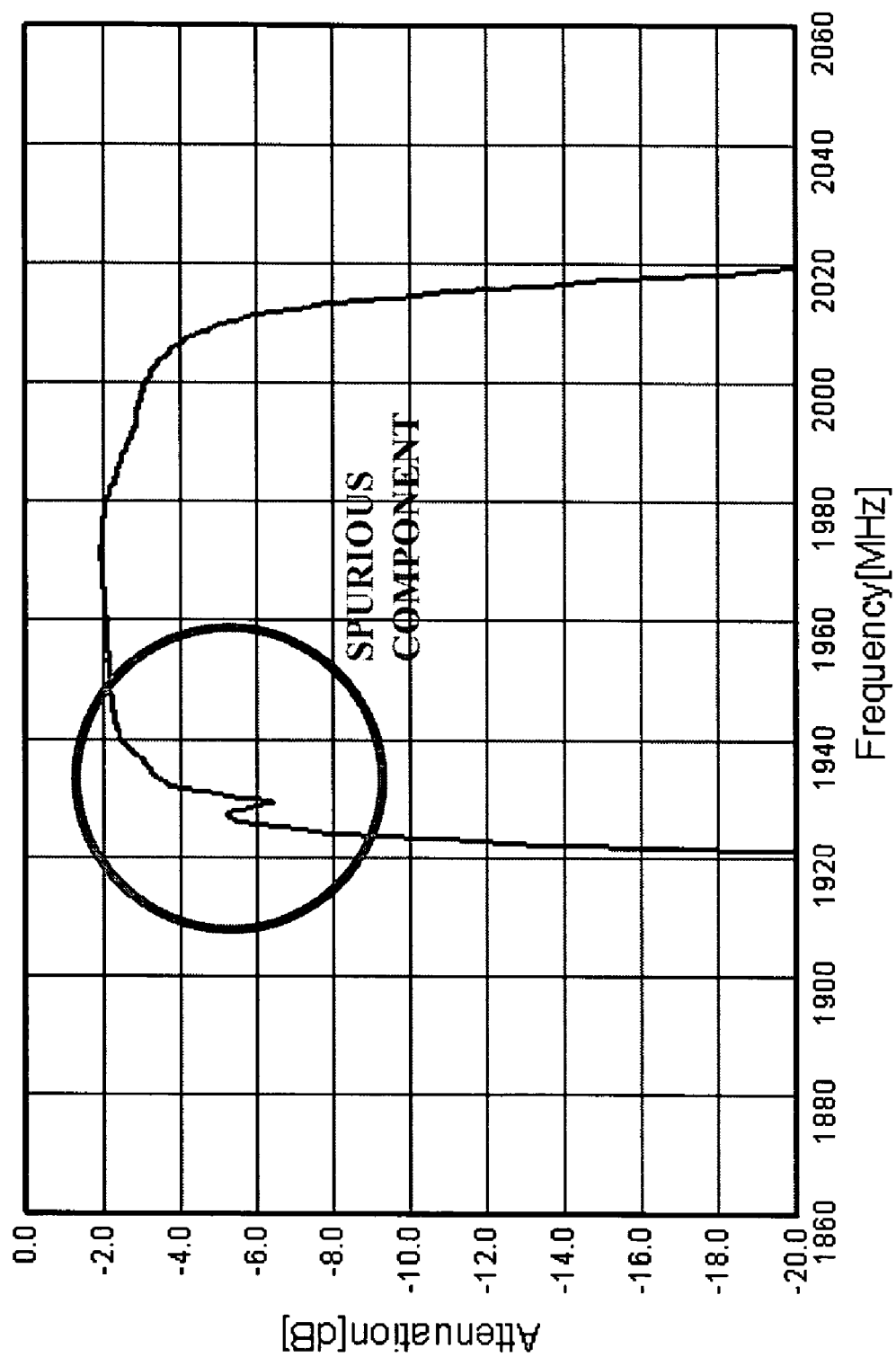
FIG. 7 is a graph showing a possibility of a spurious component in the pass band in the structure shown in FIG. 6.

FIG. 7 shows a frequency characteristic of the structure shown in FIG. 6 (AP1=AP2). The horizontal axis of FIG. 7 denotes the frequency (MHz), and the vertical axis thereof denotes the amount of attenuation (dB). As shown in FIG. 7, a spurious component appears in the low-frequency side of the pass band. A second embodiment of the present invention that will be described below is directed to a multimode type SAW filter having a structure capable of reducing the spurious component.

[Second Embodiment]

Figure 8B:
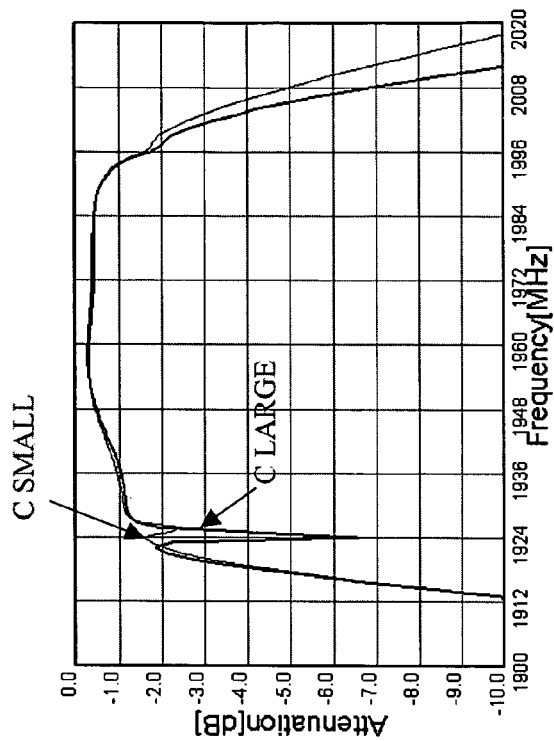
FIG. 8B is a graph showing effects of the structure shown in FIG. 8A.
Figure 8A:
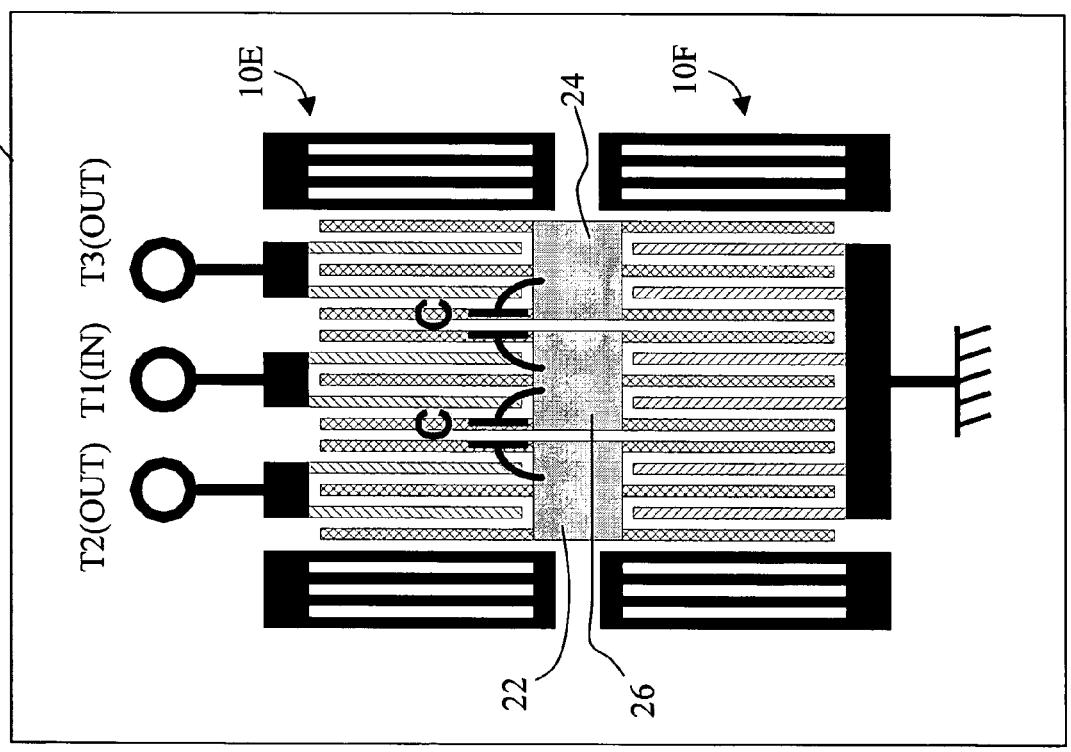
FIG. 8A shows the principle of a structure designed to suppress the spurious component shown in FIG. 7.

The second embodiment pays attention to an interpattern capacitance C in order to reduce the spurious component. As shown in FIG. 8A, there is an interpattern capacitance C between the interconnection patterns 22 and 26, which also serve as bus bars, and there is another interpattern capacitance C between the interconnection patterns 24 and 26, which also serve as bus bars. The electrode fingers connected to the interconnection patterns 22, 24 and 26 are also related to the interpattern capacitances C. FIG. 8B shows an experimental result that describes how the frequency characteristic of the multimode type SAW filter shown in FIG. 8A is affected by the magnitudes of the interpattern capacitances C. As is seen from FIG. 8B, the spurious component can be reduced by decreasing the interpattern capacitance C.

Figure 9B:
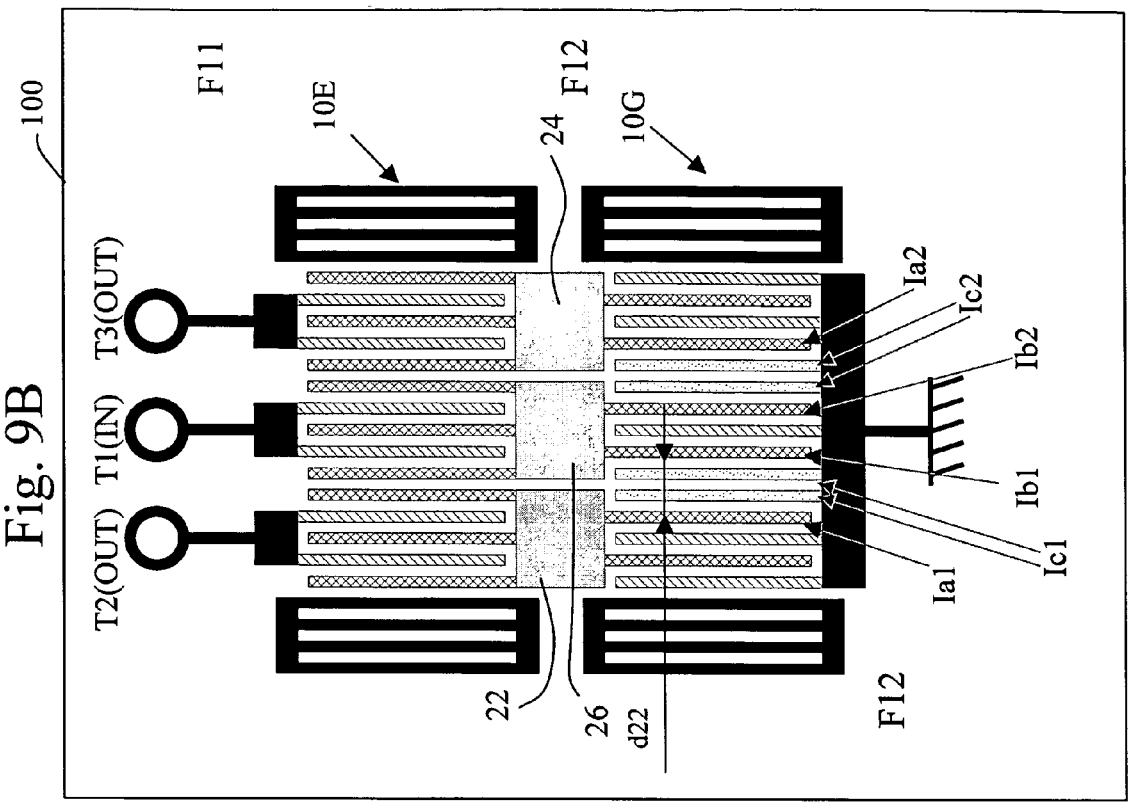
FIG. 9B shows a multimode type SAW filter according to a second embodiment.
Figure 9A:
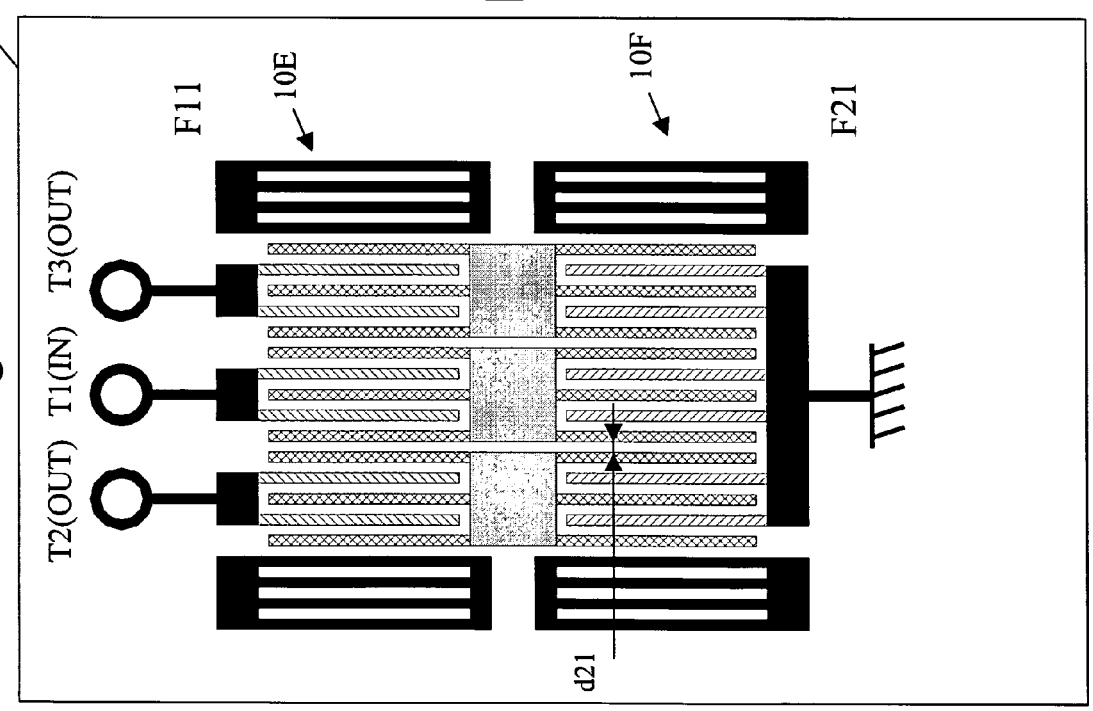
FIG. 9A shows a structure of the first embodiment of the present invention.

FIG. 9B shows a multimode type SAW filter equipped with a structure directed to reduction in the interpattern capacitance C. In FIG. 9A, the multimode type SAW filter according to the aforementioned first embodiment is illustrated for comparison with the second embodiment. The multimode type SAW filter shown in FIG. 9B includes the first filter 10E and a second filter 10G. At least one electrode finger is provided between electrode fingers extending from the bus bars 22, 24 and 26, which are adjacent interconnection patterns, in which the at least one electrode finger is at a potential different from the potentials of the adjacent interconnection patterns. More specifically, electrode fingers Ic1 at the ground potential different from the potentials of the bus bars 22 and 26 are arranged between an electrode finger Ia1 extending from an end of the bus bar 22 and an electrode finger Ib1 extending from an end of the bus bar 26 adjacent to the bus bar 22. The bus bars 22 and 26 are at the intermediate potential between the ground potential and the drive voltage applied to the input terminal T1. Similarly, electrode fingers Ic2 at the ground potential different from the potentials of the bus bars 22 and 24 are arranged between an electrode finger Ia2 extending from an end of the bus bar 22 and an electrode finger Ib2 extending from an end of the bus bar 24 adjacent to the bus bar 22. Although the structure shown in FIG. 9B has two electrode fingers Ic1 or Ic2 are arranged between the electrode fingers extending from the different bus bars, only one electrode finger at the ground potential may be arranged therebetween. As described above, the ground potential is formed between the electrode fingers Ia1 and Ib1 and between the electrode fingers Ia2 and Ib2, so that the structure shown in FIG. 9B has a smaller interpattern capacitance C than that of the structure shown in FIG. 9A and has a reduced spurious component. The distance d22 between the electrode fingers Ia1 and Ib1 is longer than the corresponding distance d21 in the structure shown in FIG. 9A. It is thus possible to further reduce the interpattern capacitance C. The composite impedance of the impedance F11 of the first filter 10E and the impedance F12 of the second filter 10G may be equal to the characteristic impedances (for example, 50 Ω) of the transmission lines connected to the multimode type SAW filter.

The multimode type SAW filter of the second embodiment is capable of restraining the intermodulation level and reducing the spurious component in the bass band as shown in FIG. 7B.

[Third Embodiment]

Figure 10B:
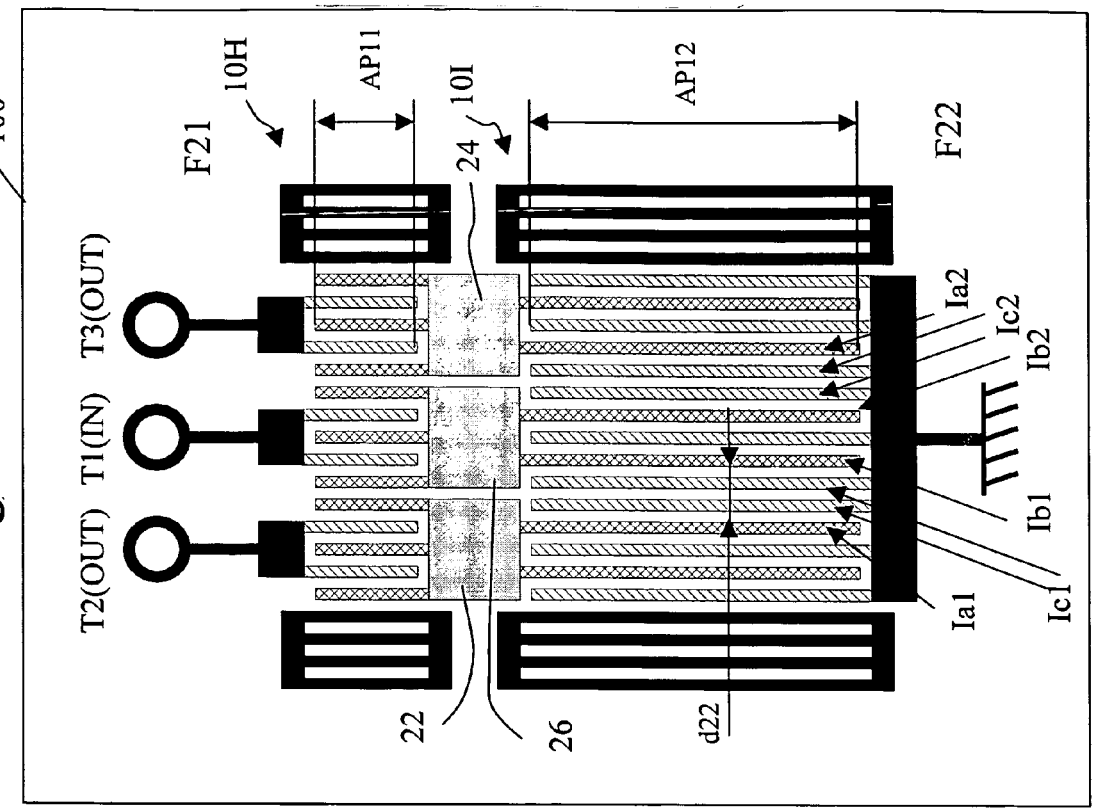
FIG. 10B shows a multimode type SAW filter according to a third embodiment of the present invention.
Figure 10A:
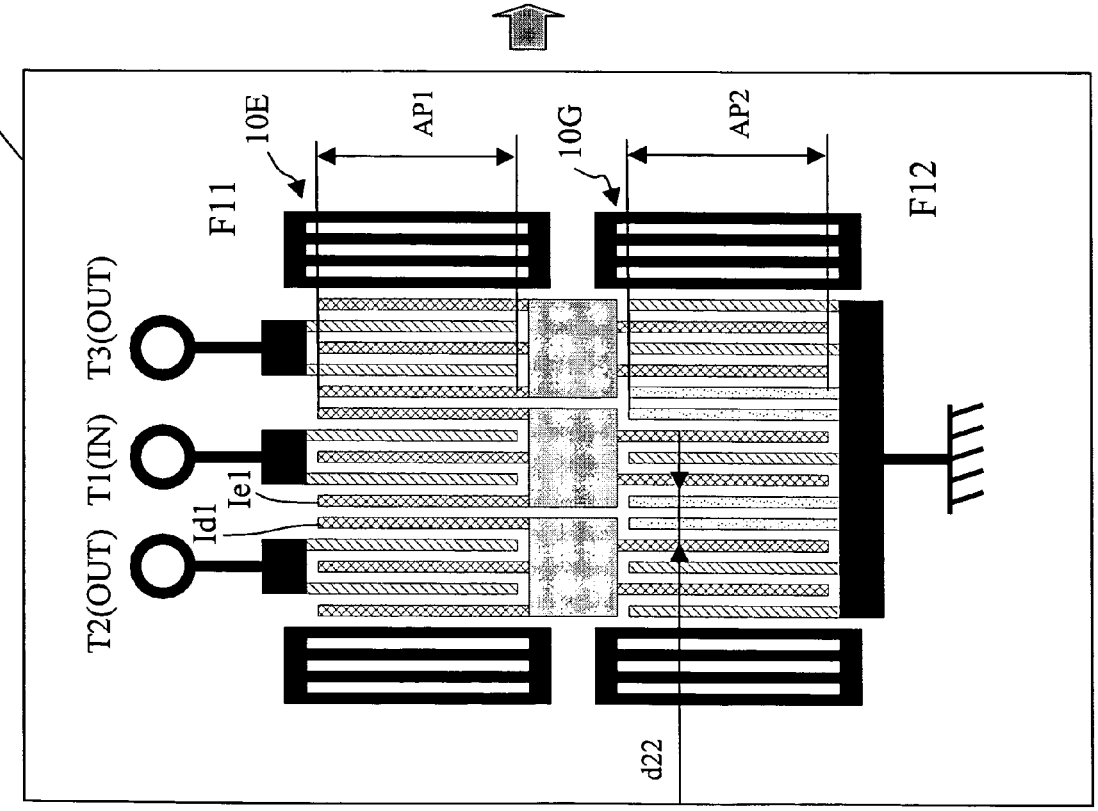
FIG. 10A shows the structure of the second embodiment.

FIG. 10B shows a multimode type SAW filter according to a third embodiment of the present invention. In FIG. 10A, the multimode type SAW filters of the above-mentioned second embodiment is illustrated for comparison with the third embodiment. In the structure shown in FIG. 10A, the lengths of the electrode fingers extending from the adjacent IDTs of the first filter 10E are involved in the interpattern capacitance C (for example, the electrode fingers Id1 and Ie1). Thus, as shown in FIG. 10B, the interpattern capacitance C can be reduced by shortening the length of the electrode fingers of the first filter 10E.

In the structure shown in FIG. 10B, a first filter 10H has shortened electrode fingers. Thus, the aperture length AP11 of the first filter 10H is smaller than the aperture length AP1 of the first filter 10E shown in FIG. 10A. Thus, the impedance F21 of the first filter 10H is greater than the impedance F11 of the first filter 10E shown in FIG. 10A. In order to set the composite impedance of the first filter 10H and a second filter 10I equal to the desired impedance (for example, 50 Ω), the aperture length AP12 of the second filter 10I is made greater. Even in this case, the interpattern capacitance C is not increased because the second filter 10I is configured so that the electrode fingers Ic1 and Ic2 at the ground potential different from the potentials of the bus bars 22, 24 and 26, like the second filter 10G shown in FIG. 9B.

The multimode type SAW filter according to the third embodiment can restrain the intermodulation level and further reduces the spurious component in the pass band.

[Fourth Embodiment]

Figure 11B:
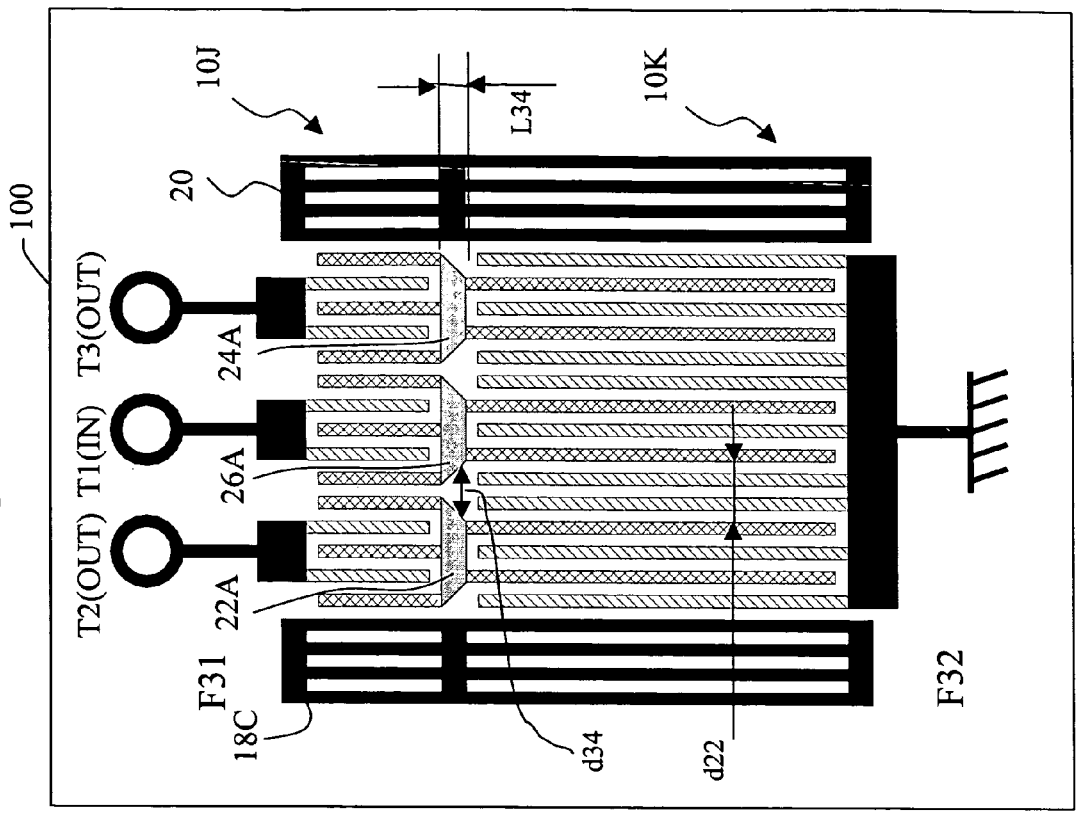
FIG. 11B shows a multimode type SAW filter according to a fourth embodiment of the present invention.
Figure 11A:
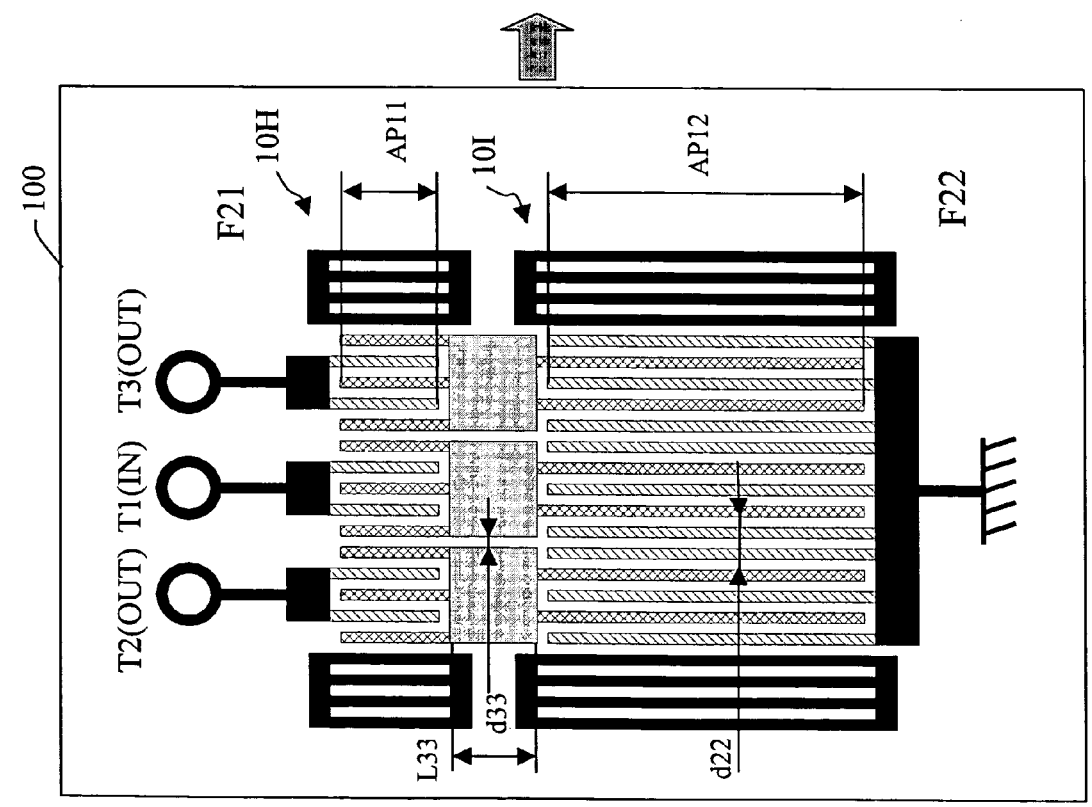
FIG. 11A shows the structure of a third embodiment.

FIG. 11B shows a multimode type SAW filter according to a fourth embodiment of the present invention. In FIG. 11A, the multimode type SAW filter of the aforementioned third embodiment is illustrate for comparison with the fourth embodiment. The multimode type SAW filter of the fourth embodiment includes a first filter 10J and a second filter 10K, which have common bus bars 22A, 24A and 26A also serving as interconnection patterns via which these filters are connected in series. A distance d34 (interpattern distance) between the adjacent edges of the bus bars 22A and 26A and another distance d34 between the adjacent edges of the bus bars 24A and 26A are longer than a corresponding distance d33 shown in FIG. 11A. In order to increase the distance d34 to thus reduce the interpattern capacitance C, the edges of the bus bars 22A, 24A and 26A are tapered. Widths L34 of the bus bars 22A, 24A and 26A are made narrower than the widths L33 of the bus bars 22, 24 and 26 shown in FIG. 11A, so that the interpattern capacitance C can be reduced. The composite impedance of the impedance F31 of the first filter 10J and the impedance F32 of the second filter 10K is equal to the characteristic impedance of the transmission lines to which the multimode type SAW filters of the fourth embodiment are connected. The reflection electrodes 18C and 18D shown in FIG. 11B have a common bus bar, and the reflection electrodes 20C and 20D have a common bus bar.

The multimode type SAW filter according to the fourth embodiment can restrain the intermodulation level and further reduce the spurious component in the pass band.

[Fifth Embodiment]

Figure 1A:
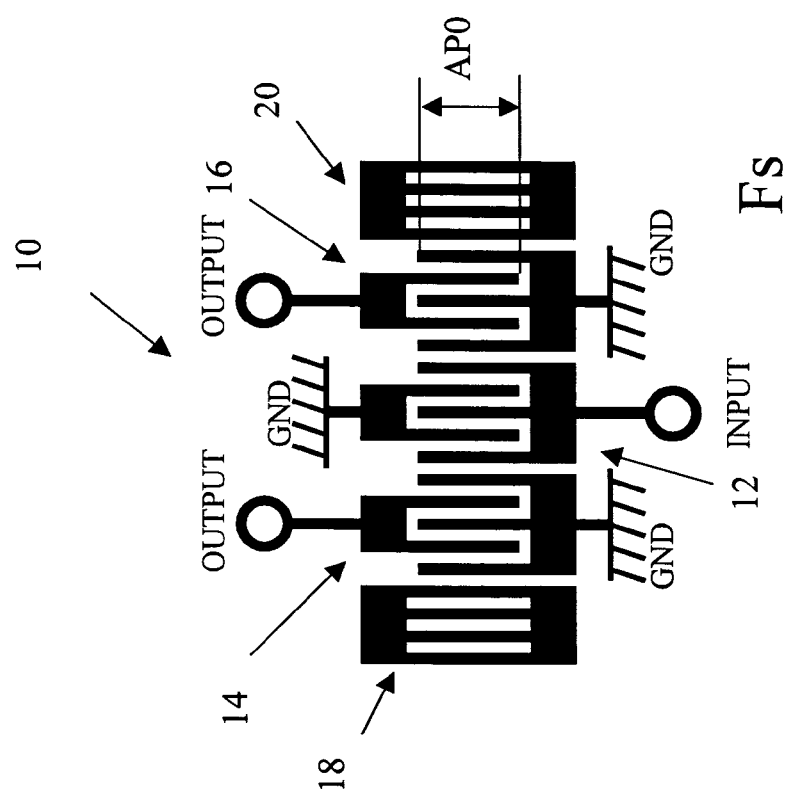
FIG. 1A shows a unit of multimode type SAW filter.
Figure 2:
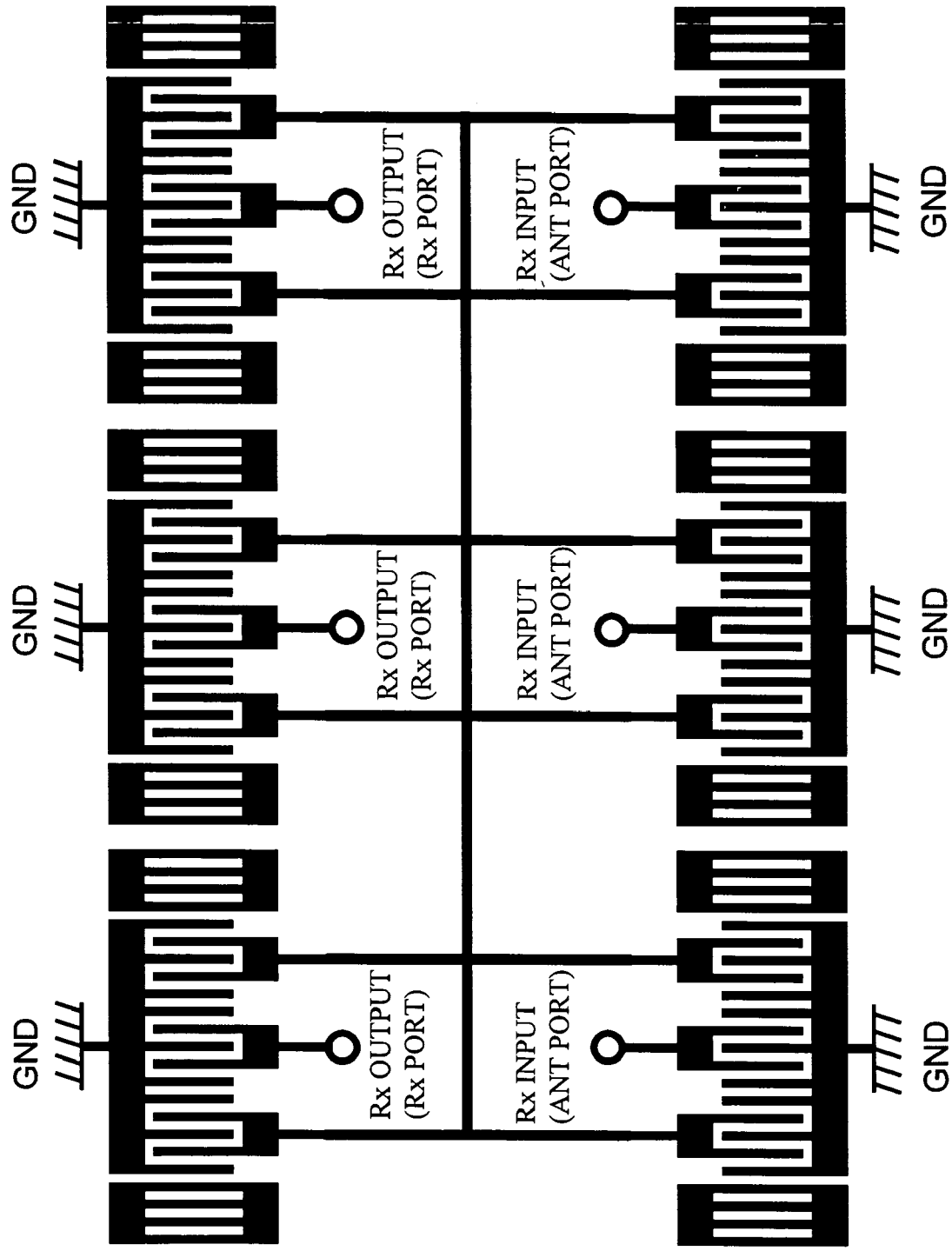
FIG. 2 shows another conventional multimode type SAW filter having three cascaded structures, each being as shown in FIG. 1B.
Figure 12:
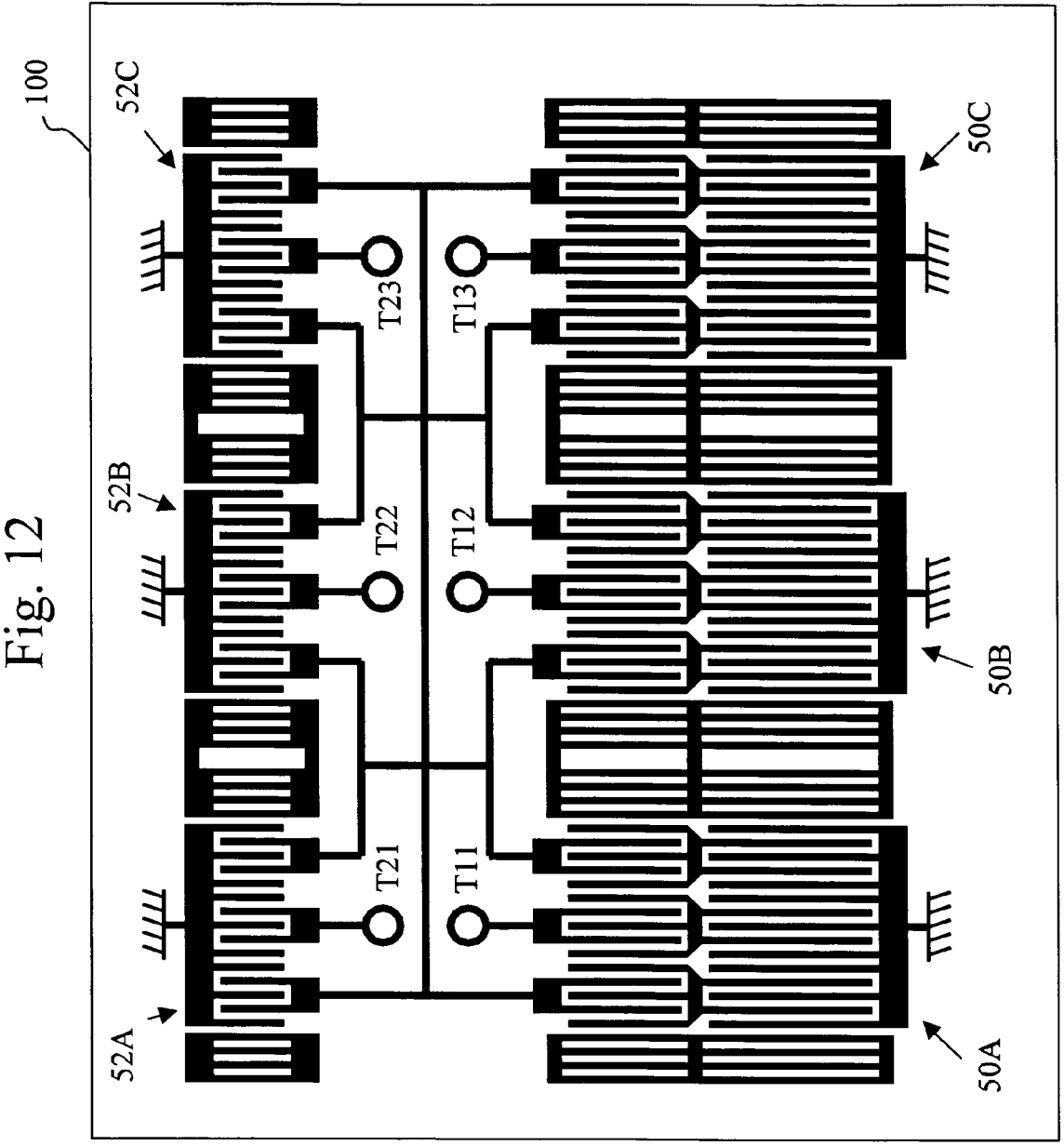
FIG. 12 shows a multimode type SAW filter according to a fifth embodiment of the present invention.

FIG. 12 shows a multimode type SAW filter according to a fifth embodiment of the present invention. As indicated by reference numerals 50A, 50B and 50C, three multimode type SAW filters, each shown in FIG. 11B, are connected in parallel, and multimode type SAW filters 52A, 52B and 52C of unit type as shown in FIG. 1A or 4A are cascaded to the filters 50A, 50B and 50C, respectively. The terminals T11, T12 and T13 function as input terminals, and terminals T21, T22 and T23 function as output terminals. The identical signal is applied to the input terminals T11, T12 and T13, and output signals in phase are available at the output terminals T21, T22 and T23.

The multimode type SAW filter according to the fifth embodiment is capable of restraining the intermodulation level, effectively reducing the spurious component in the pass band, and improving the power durability.

Figure 13:
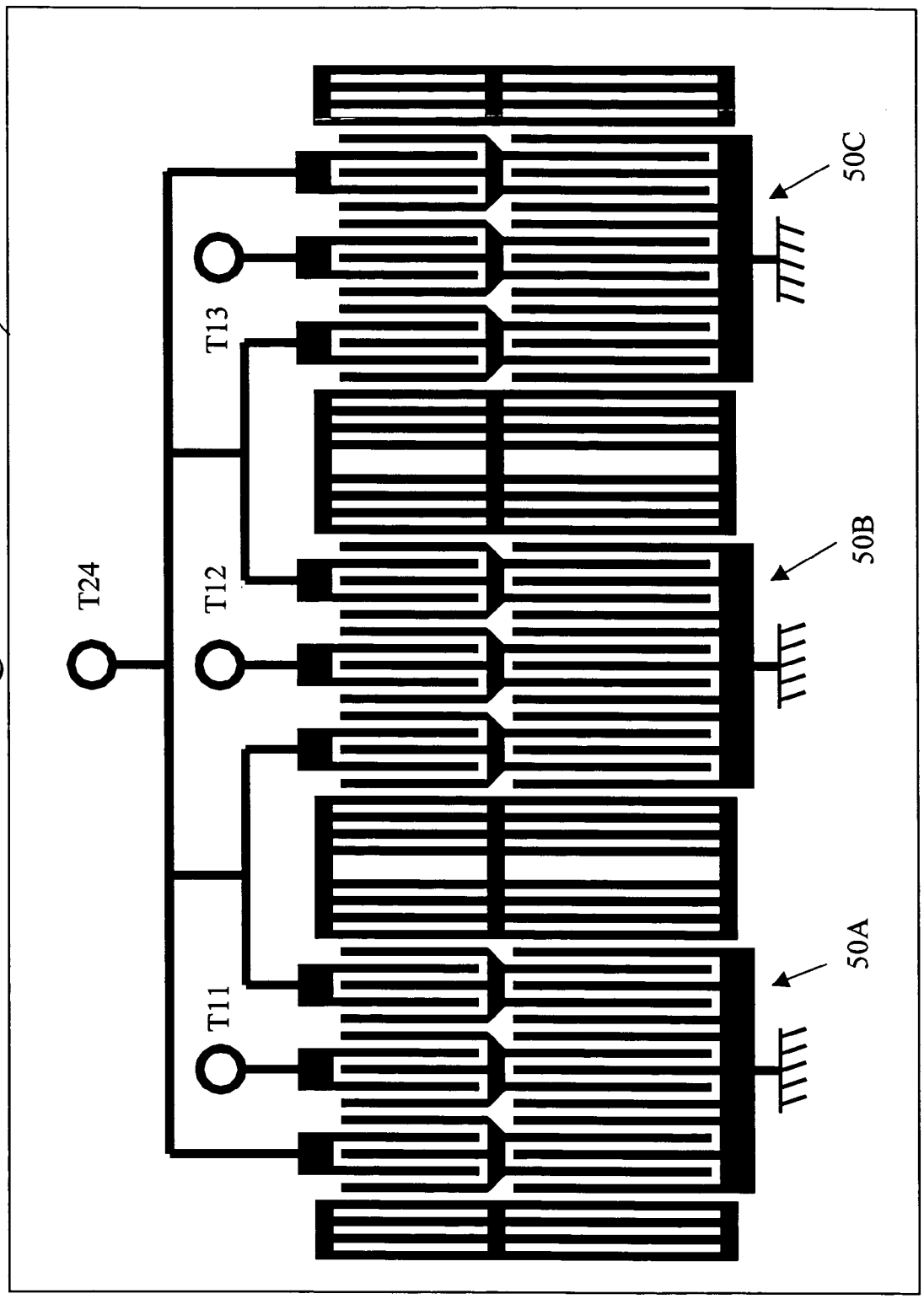
FIG. 13 shows a variation of the fifth embodiment.

FIG. 13 shows a variation of the multimode type SAW filter shown in FIG. 12. The outputs of the filters 50A, 50B and 50C are commonly connected to an output terminal T24.

Figure 14:
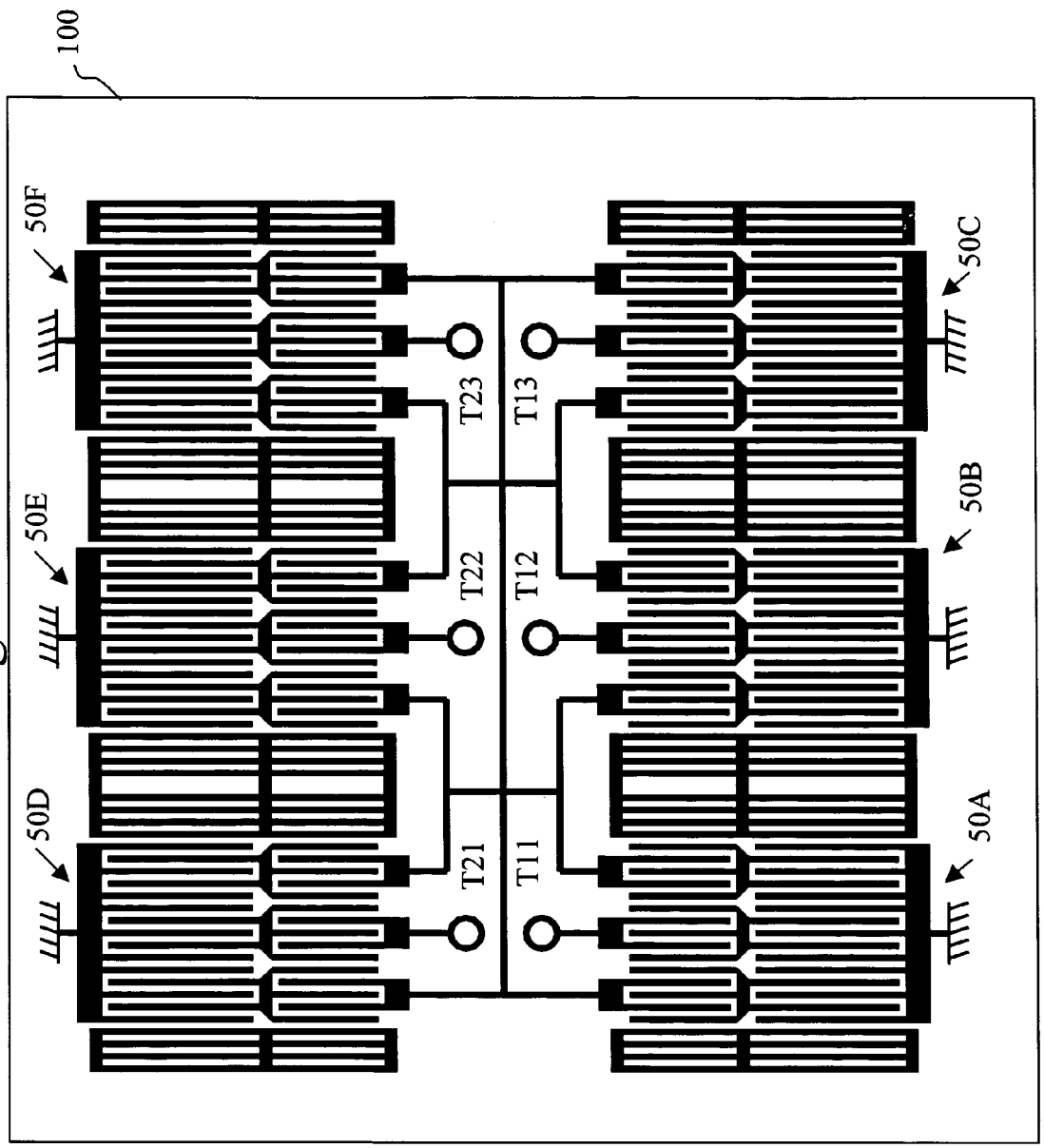
FIG. 14 shows another variation of the fifth embodiment.

FIG. 14 shows a second variation of the multimode type SAW filter shown in FIG. 12. The SAW filter shown in FIG. 14 includes a group of filters 50A, SOB and 50C, and another group of filters 50D, 50E and 50F, which are respectively cascaded thereto. The filters 50D, 50E and 50F are configured as shown in FIG. 11B.

Figure 15:
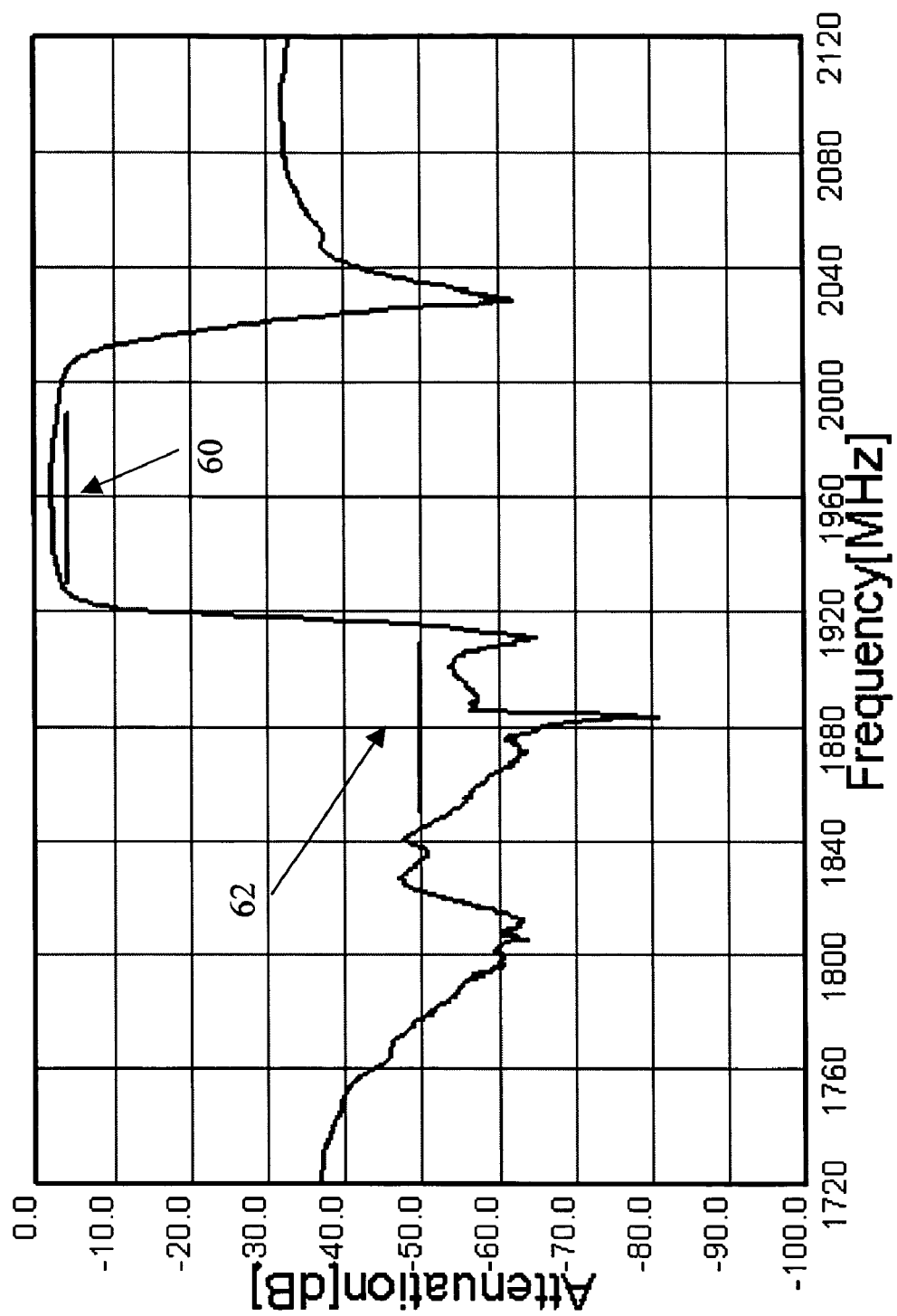
FIG. 15 is a graph of the filter characteristic of the fifth embodiment.

FIG. 15 shows a frequency characteristic of the multimode type SAW filter according to the fifth embodiment, in which the horizontal axis denotes the frequency (MHz) and the vertical axis denotes the amount of attenuation (dB). A line indicated by a reference numeral 60 shows an amount of attenuation of –3 dB, which corresponds to the amount of insertion loss generally required. Another line indicated by a reference numeral 62 shows an amount of attenuation of –50 dB, which corresponds to the amount of out-of-band attenuation generally required. It can be seen from FIG. 15 that the multimode type SAW filter of the fifth embodiment has a small insertion loss and a large out-of-band attenuation.

[Sixth Embodiment]

A six embodiment of the present invention is a balanced filter. FIG. 16A shows a unit of balanced type multimode SAW filter according to the sixth embodiment. Referring to FIG. 16A, signals B1 and B2 are balanced inputs or balanced outputs. In order to realize the balanced filter, the IDT 14B and the IDT 16C have different electrode structures. More specifically, adjacent electrode fingers of the IDTs 12B and 14B are connected to the bus bars 26 and 22, respectively, while adjacent electrode fingers of the IDTs 12B and 16C are connected to the bus bars 26 and 28, respectively.

Figure 16B:
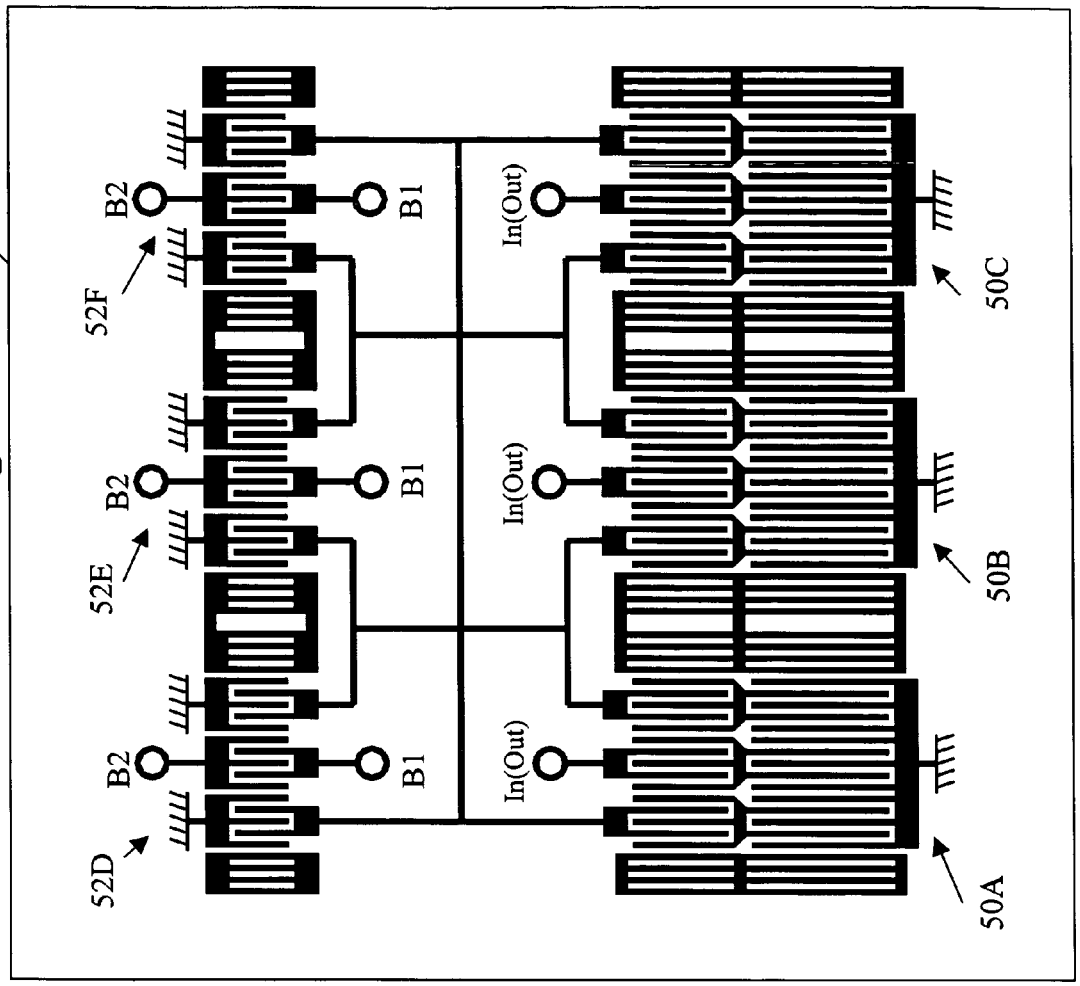
FIG. 16B shows a cascade type balanced multimode SAW filter according to the sixth embodiment.
Figure 16A:
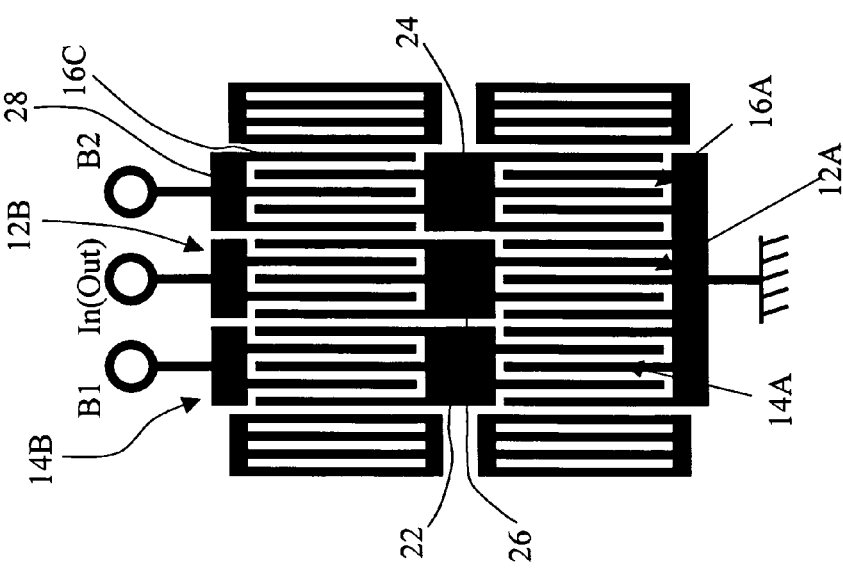
FIG. 16A shows a unit of a balanced type multimode SAW filter according to a sixth embodiment.

FIG. 16B shows a cascaded type balanced multimode SAW filter according to the sixth embodiment. Referring to this figure, multimode type SAW filters of unit type 52D, 52E and 52F are respectively cascaded to the multimode type SAW filters 50A, 50B and 50C connected in parallel. Each of the filters 52D, 52E and 52F has balanced outputs or inputs indicated by B1 and B2.

Even in the balanced type multimode SAW filter, the multimode type SAW filters 50A, 50B and 50C have the aforementioned structures, functions and effects. It is thus possible to restrain the intermodulation level and further reduce the spurious component in the pass band.

[Seventh Embodiment]

Figure 3B:
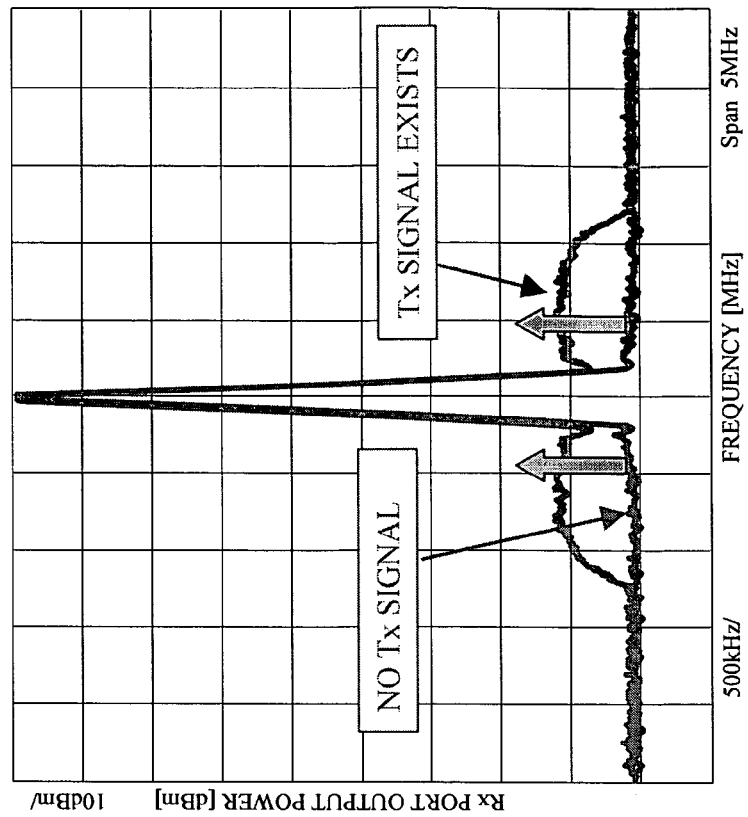
FIG. 3B shows a problem of the application.
Figure 3A:
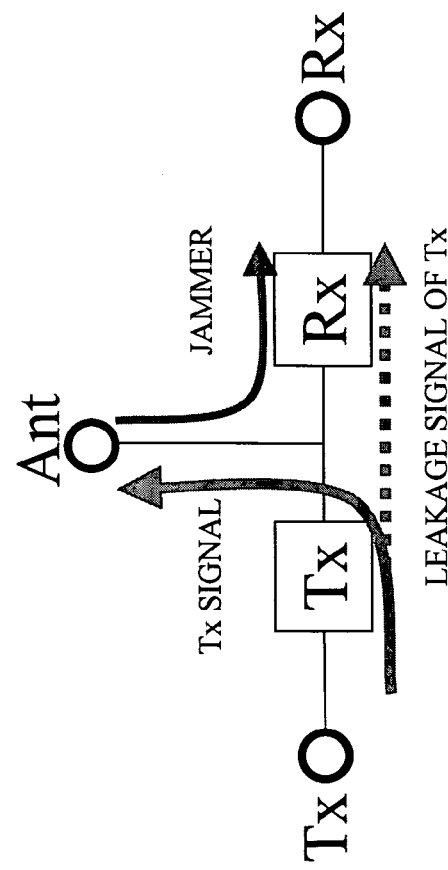
FIG. 3A shows an application of the multimode type SAW filter.
Figure 17:
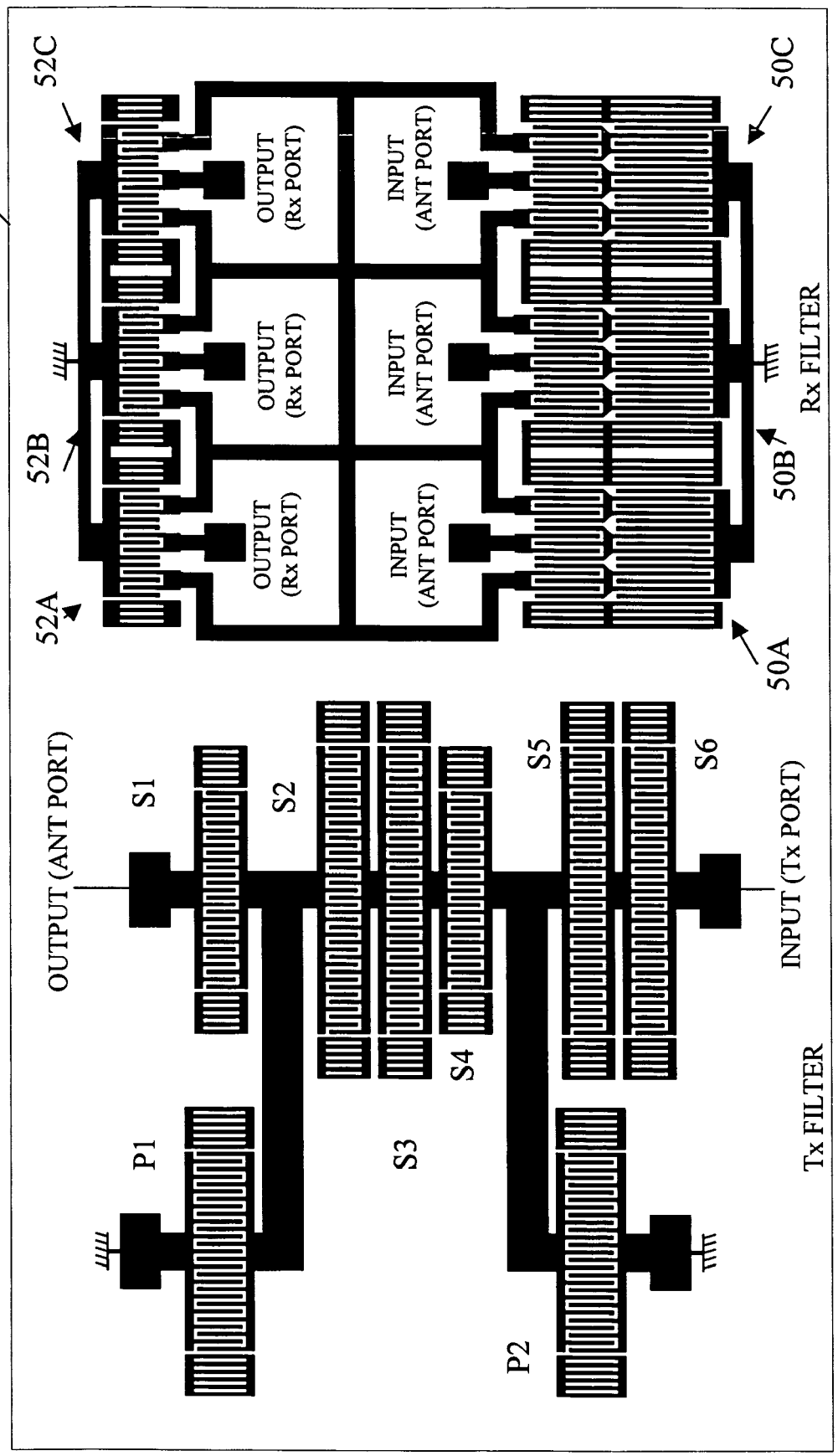
FIG. 17 shows a duplexer according to a seventh embodiment of the present invention.

FIG. 17 shows a duplexer according to a seventh embodiment of the present invention. This duplexer is a SAW device having a single package in which the transmit filter Tx and the receive filter Rx shown in FIG. 3A are built. The transmit filter Tx has a ladder arrangement of SAW resonators, and the receive filter Rx has the arrangement shown in FIG. 12B. The transmit filter Tx and the receive filter Rx are formed on a single piezoelectric substrate 100. The transmit filter Tx includes SAW resonators S1–S6 in series arms of the ladder arrangement, and SAW resonators P1 and P2 in parallel arms. The duplexer thus configured is capable of suppressing the intermodulation level, which is the influence of the leakage component from the transmit filter Tx to the receiver filter Rx, and the spurious component in the pass band of the receive filter Rx.

The present duplexer may be used to separate transmit signals in the range of, for example, 1850 MHz to 1910 MHz and receive signals in the range of, for example, 1930 MHz to 1990 MHz from each other in communications apparatuses such as PCS portable phones.

The present invention is not limited to the specifically disclosed embodiments, and variations and modifications may be made without departing from the scope of the present invention.

The present invention is based on Japanese Patent Application No. 2004-252644 filed on Aug. 31, 2004, the entire disclosure of which is hereby incorporated by reference.

What is claimed is:

1. A surface acoustic wave device having a given impedance comprising:
   multimode type filters connected in series,
   a composite impedance of the multimode type filters defining the given impedance of the surface acoustic wave device,
   wherein each of the multimode type filters has multiple interdigital transducers (IDTs), and corresponding IDTs of the multimode type filters among the multiple IDTs are separately connected in series.

2. The surface acoustic wave device as claimed in claim 1, wherein the given impedance is equal to a characteristic impedance of a transmission line to which the surface acoustic wave device is connected.

3. The surface acoustic wave device as claimed in claim 1, wherein each of the multimode type filters has multiple interdigital transducers (IDTs), and corresponding IDTs of the multimode type filters among the multiple IDTs are connected in series by common bus bars, which have tapered ends.

4. The surface acoustic wave device as claimed in claim 1, wherein the multimode type filters have different electrostatic capacitances.

5. The surface acoustic wave device as claimed in claim 1, wherein the multimode type filters have different aperture lengths.

6. The surface acoustic wave device as claimed in claim 1, wherein the multimode type filters include a first multimode type filter to which an input terminal of the surface acoustic wave device is connected, and a second multimode type filter to which an output terminal of the surface acoustic wave device is connected.

7. The surface acoustic wave device as claimed in claim 1, wherein the multimode type filters includes a first multimode type filter to which one of input and output terminals of the surface acoustic wave device is connected.

8. The surface acoustic wave device as claimed in claim 1, further comprising a plurality of groups of multimode type filters connected in parallel, wherein each of the plurality of groups of multimode type filters includes said multimode type filters connected in series.

9. The surface acoustic wave device as claimed in claim 1, wherein one of the multimode type filters arranged on an output side of the surface acoustic wave device is cascaded to another multimode type filter.

10. The surface acoustic wave device as claimed in claim 1 further comprising a plurality of groups of multimode type filters connected in parallel, wherein each of the plurality of groups of multimode type filters includes said multimode type filters connected in series, and multimode type filters arranged on an output side of the surface acoustic wave device are cascaded to other multimode type filters.

11. The surface acoustic wave device as claimed in claim 1, further comprising balanced input or output terminals.

12. The surface acoustic wave device as claimed in claim 1, further comprising a piezoelectric substrate on which the multimode type filters are formed.

13. The surface acoustic wave device as claimed in claim 1, further comprising a first filter to which one of transmitted and received signals is applied, and a second filter to which the other one is applied, wherein one of the first and second filters includes said multimode type filters.

14. The surface acoustic wave device as claimed in claim 13, wherein the first and second filters are formed on an identical piezoelectric substrate.

15. A surface acoustic wave device having a given impedance comprising:

multimode type filters connected in series, a composite impedance of the multimode type filters defining the given impedance of the surface acoustic wave device, wherein:

each of the multimode type filters has multiple interdigital transducers (IDTs);

corresponding IDTs of the multimode type filters among the multiple IDTs are separately connected in series by interconnection patterns;

at least one electrode finger is arranged between electrode fingers respectively extending from adjacent interconnection patterns; and said at least one electrode finger is at a potential different from potentials of the adjacent interconnection patterns.

* * * * *